(12) United States Patent
Chew et al.

(10) Patent No.: US 10,154,588 B2
(45) Date of Patent: Dec. 11, 2018

(54) MANUFACTURING METHOD OF SEMICONDUCTOR PACKAGE

(71) Applicant: ADVANPACK SOLUTIONS PTE LTD., Singapore (SG)

(72) Inventors: Hwee-Seng Jimmy Chew, Singapore (SG); Shoa-Siong Raymond Lim, Singapore (SG)

(73) Assignee: ADVANPACK SOLUTIONS PTE LTD., Singapore (SG)

( * ) Notice: Subject to any disclaimer, the term of this patent is extended or adjusted under 35 U.S.C. 154(b) by 0 days.

(21) Appl. No.: 15/636,792

(22) Filed: Jun. 29, 2017

(65) Prior Publication Data

US 2017/0303399 A1 Oct. 19, 2017

Related U.S. Application Data

(62) Division of application No. 13/720,353, filed on Dec. 19, 2012, now Pat. No. 9,723,717.

(Continued)

(51) Int. Cl.
*H01L 21/4763* (2006.01)
*H05K 1/18* (2006.01)
(Continued)

(52) U.S. Cl.
CPC ........... *H05K 1/18* (2013.01); *H01L 21/4828* (2013.01); *H01L 23/142* (2013.01);
(Continued)

(58) Field of Classification Search
CPC ................ H05K 1/18; H01L 23/49582; H01L 23/49861; H01L 21/4828; H01L 23/142;
(Continued)

(56) References Cited

U.S. PATENT DOCUMENTS

| 6,538,210 | B2 | 3/2003 | Sugaya et al. |
| 7,394,663 | B2 | 7/2008 | Yamashita et al. |

(Continued)

FOREIGN PATENT DOCUMENTS

| CN | 1577819 A | 2/2005 |
| CN | 101335253 A | 12/2008 |

(Continued)

*Primary Examiner* — Thinh T Nguyen
(74) *Attorney, Agent, or Firm* — Rabin & Berdo, P.C.

(57) ABSTRACT

A manufacturing method of a semiconductor package includes the following steps. Firstly, a conductive carrier is provided. Then, a first conductive layer is formed on a lower surface of the conductive carrier. Then, a second conductive layer is formed on a lower surface of the first conductive layer, wherein the second conductive layer and the first conductive layer together constitute a conductive structure. Then, an electrical component is disposed on the lower surface of the first conductive layer. Then, a first package body encapsulating the first conductive layer, the second conductive layer and the electrical component but not covering an edge of the lower surface of the conductive carrier is formed. Then, a portion of the first package body is removed. Then, partial material of the conductive carrier is removed, such that a reserved part of the conductive carrier forms a ring-shaped conductive structure.

16 Claims, 9 Drawing Sheets

Related U.S. Application Data

(60) Provisional application No. 61/577,132, filed on Dec. 19, 2011.

(51) Int. Cl.
| | | |
|---|---|---|
| *H01L 23/14* | (2006.01) | |
| *H01L 23/00* | (2006.01) | |
| *H01L 23/495* | (2006.01) | |
| *H01L 23/498* | (2006.01) | |
| *H01L 21/48* | (2006.01) | |
| *H01L 23/31* | (2006.01) | |
| *H01L 21/56* | (2006.01) | |

(52) U.S. Cl.
CPC .. *H01L 23/49537* (2013.01); *H01L 23/49582* (2013.01); *H01L 23/49861* (2013.01); *H01L 24/80* (2013.01); *H01L 24/97* (2013.01); *H01L 21/561* (2013.01); *H01L 21/565* (2013.01); *H01L 21/568* (2013.01); *H01L 23/3107* (2013.01); *H01L 23/3128* (2013.01); *H01L 24/16* (2013.01); *H01L 24/32* (2013.01); *H01L 24/48* (2013.01); *H01L 24/73* (2013.01); *H01L 2224/131* (2013.01); *H01L 2224/13082* (2013.01); *H01L 2224/16225* (2013.01); *H01L 2224/32225* (2013.01); *H01L 2224/45015* (2013.01); *H01L 2224/48091* (2013.01); *H01L 2224/48227* (2013.01); *H01L 2224/73204* (2013.01); *H01L 2224/73265* (2013.01); *H01L 2224/81* (2013.01); *H01L 2224/97* (2013.01); *H01L 2924/00014* (2013.01); *H01L 2924/12042* (2013.01); *H01L 2924/15311* (2013.01); *H01L 2924/181* (2013.01)

(58) Field of Classification Search
CPC ... H01L 24/80; H01L 24/97; H01L 23/49537; H01L 2224/48091; H01L 2224/45015; H01L 2224/32225; H01L 2224/13082; H01L 24/32
USPC ....... 438/629, 637, 639, 668, 108, 700, 112, 438/124, 127; 257/774, 787
See application file for complete search history.

(56) References Cited

U.S. PATENT DOCUMENTS

| | | | |
|---|---|---|---|
| 7,563,650 | B2 | 7/2009 | Nishikawa |
| 8,487,431 | B2 | 7/2013 | Jin et al. |
| 2001/0030059 | A1 | 10/2001 | Sugaya et al. |
| 2002/0135058 | A1 | 9/2002 | Asahi et al. |
| 2005/0006142 | A1 | 1/2005 | Ishimaru et al. |
| 2005/0017346 | A1* | 1/2005 | Yamagata ......... H01L 23/49816 257/701 |
| 2005/0077624 | A1 | 4/2005 | Tan et al. |
| 2005/0077630 | A1 | 4/2005 | Kirby et al. |
| 2006/0252262 | A1 | 11/2006 | Kazemi |
| 2011/0210439 | A1 | 9/2011 | Lim et al. |

FOREIGN PATENT DOCUMENTS

| | | |
|---|---|---|
| TW | 452903 B | 9/2001 |
| TW | 200814268 A | 3/2008 |
| TW | 201042744 A | 12/2010 |

\* cited by examiner

MANUFACTURING METHOD OF SEMICONDUCTOR PACKAGE

The application is a divisional application of U.S. patent application Ser. No. 13/720,353 filed on Dec. 19, 2012, the subject matter of the application is incorporated herein by reference. This application claims the benefit of U.S. provisional application Ser. No. 61/577,132, filed on Dec. 19, 2011, the disclosure of which is incorporated by reference herein in its entirety.

BACKGROUND OF THE INVENTION

Field of the Invention

The invention relates in general to a manufacturing method of a semiconductor package, and more particularly to a manufacturing method of a semiconductor package with a conductive layer.

Description of the Related Art

With the booming growth in the electronic industry, the semiconductor packaging technology also gains continual progress. In general, the semiconductor packaging technology uses a leadframe to carry a chip, and further uses a molding compound to seal the leadframe and the substrate to avoid the chip being moisturized or damaged due to collision. The chip is electrically connected to the external through a pad of the leadframe for electrically connecting a printed circuit board.

However, the leadframe, being heavy in weight and large in size, is not conformed to the trend of lightweight, compactness and slimness pursued in the industry of electronic products.

SUMMARY OF THE INVENTION

The invention is directed to a manufacturing method of a semiconductor package capable of providing a conductive layer with small thickness to further downsize the substrate structure and the semiconductor package.

According to an alternate embodiment of the present invention, a manufacturing method of semiconductor package is provided. The manufacturing method comprises the following steps. A conductive carrier is provided, wherein the conductive carrier has an upper surface and a lower surface opposite to the upper surface. A first conductive layer is formed on the lower surface of the conductive carrier, wherein the first conductive layer has a lower surface. A second conductive layer is formed on the lower surface of the first conductive layer, wherein the second conductive layer and the first conductive layer together constitute a conductive structure. An electrical component is disposed on the lower surface of the first conductive layer. A first package body is formed, wherein the first package body encapsulates the first conductive layer, the second conductive layer and the electrical component but does not cover an edge of the lower surface of the conductive carrier. A portion of the first package body is removed until the second conductive layer is exposed. A partial material of the conductive carrier is removed, such that a reserved part of the conductive carrier forms a ring-shaped conductive structure, wherein the ring-shaped conductive structure is disposed on the upper surface of the package body and surrounds the conductive structure and the electrical component to expose the upper surface of the conductive structure.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
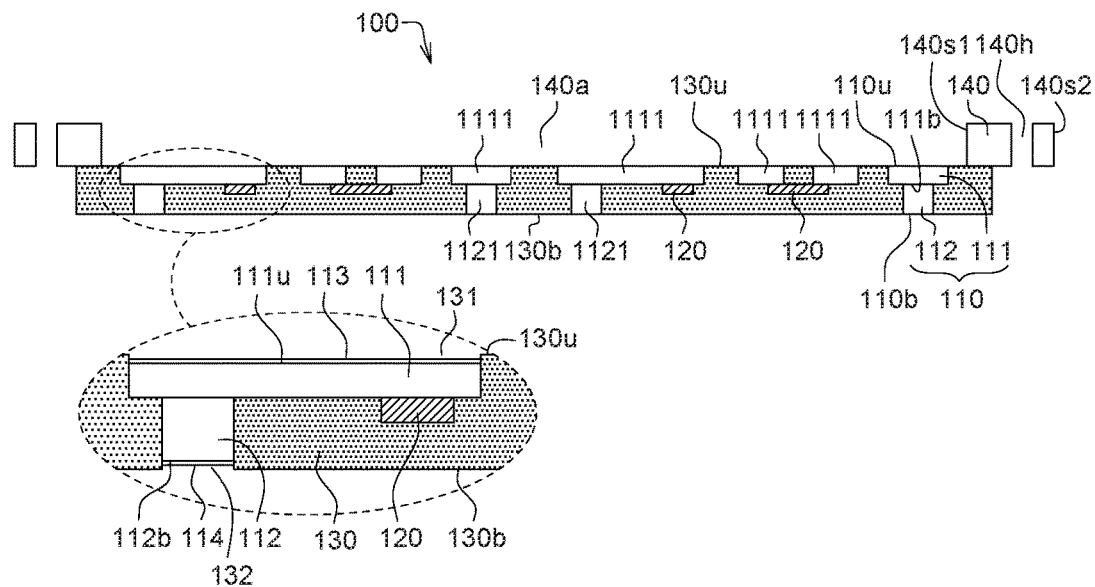
FIG. 1 shows a cross-sectional view of a substrate structure according to an embodiment of the invention.

Referring to FIG. 1, a cross-sectional view of a substrate structure according to an embodiment of the invention is shown. The substrate structure 100 comprises a conductive structure 110, an electrical component 120, a first package body 130 and a ring-shaped conductive structure 140.

The conductive structure 110 comprises a first conductive layer 111 and a second conductive layer 112, wherein the first conductive layer 111 has an upper surface 111$u$ and a lower surface 111$b$ opposite to the upper surface 111$u$, and the second conductive layer 112 is disposed on the lower surface 111$b$ of the first conductive layer 111.

The first conductive layer 111 can be formed by such as copper, nickel, palladium, gold or other materials, and the material of the second conductive layer 112 is similar to that of the first conductive layer 111. The first conductive layer 111 and the second conductive layer 112 can be formed by the same or different materials.

The first conductive layer 111 comprises at least one trace 1111. The second conductive layer 112 comprises at least one conductive stud 1121 each being disposed on the lower surface 111$b$ of the corresponding trace 1111. The lower surface 110$b$ of the conductive structure 110 is exposed from the lower surface 130$b$ of the first package body 130 for electrically connecting an external circuit component (not illustrated) such as a circuit board.

The first conductive layer 111 is etched by the micro-etching process, such that the upper surface 111$u$ is depressed with respect to the upper surface 130$u$ of the first package body 130 to form a first depressed portion 131. Similarly, the second conductive layer 112 is etched by the micro-etching process, such that the lower surface 112$b$ is depressed with respect to the lower surface 130$b$ of the first package body 130 to form a second depressed portion 132.

The conductive structure 110 further comprises a first surface finishing layer 113 formed on an upper surface 111$u$ of the first conductive layer 111 and located in the first depressed portion 131. The upper surface of the first surface finishing layer 113 is depressed with respect to the upper surface 130$u$ of the first package body 130. However, the upper surface of the first surface finishing layer 113 can also be aligned with or protruded towards the upper surface 130u. Preferably, an additional connection pad can be formed on a selective position of the first conductive layer 111 for bonding the chip. The first surface finishing layer 113 can be formed by way of electro plating, electroless plating or immersion. Besides, the conductive structure 110 further comprises a second surface finishing layer 114 formed on a lower surface 112b of the second conductive layer 112 and located in the second depressed portion 132. The upper surface of the second surface finishing layer 114 is depressed with respect to the lower surface 130b of the first package body 130. However, the upper surface of the second surface finishing layer 114 can also be aligned with or protruded towards the lower surface 130b. The method of forming the second surface finishing layer 114 is similar to that of forming the first surface finishing layer 113. The first surface finishing layer 113 and the second surface finishing layer 114 can be formed in the same or different manufacturing processes. Furthermore, the first surface finishing layer 113 can be formed by copper, nickel, palladium, gold, silver, tine or other materials, the material of the second surface finishing layer 114 is similar to that of the first surface finishing layer 113, and can be exactly the same with or different from that of the first surface finishing layer 113. In another embodiment, the first surface finishing layer 113 and the second surface finishing layer 114 can be omitted.

The electrical component 120 is disposed on the lower surface 111b of the first conductive layer 111, and crosses over two traces 1111 for electrically connecting the two traces 1111. The traces 1111 crossed by the electrical component 120 can be two adjacent traces 1111. Or, the electrical component 120 can be formed on one single trace 1111. In the present embodiment, the electrical component 120 is a passive component. However, the embodiment of the invention does not specify the variety of the electrical component 120.

The first package body 130 encapsulates the conductive structure 110 and the electrical component 120 and has an upper surface 130u. The conductive structure 110 and the electrical component 120 are embedded in the first package body 130 and are protected by the first package body 130. The first package body 130 is formed by a dielectric material or an insulating material. The first package body 130 is formed by a thermosetting polymeric resin such as epoxy resin. Preferably, the first package body 130 is formed by a molding compound material containing silica filler.

The ring-shaped conductive structure 140 can be used as a hand grip of the substrate structure 100 for conveniently grasping or moving the substrate structure 100. In greater details, during the process of grasping or moving the substrate structure 100, the conductive structure 110 or the first package body 130 will be touched and mechanically damaged if the ring-shaped conductive structure 140 is omitted. The ring-shaped conductive structure 140 surrounds the conductive structure 110 and the electrical component 120 and is disposed at the edge of the upper surface 130u of the first package body 130 to expose the conductive structure 110. In greater details, the ring-shaped conductive structure 140 has an opening 140a and a through hole 140h, wherein the opening 140a exposes the upper surface 110u of the conductive structure 110 and the upper surface 130u of the package body 130, and the through hole 140h is located between the inner wall 140s1 and the outer wall 140s2 of the opening 140a without overlapping the first package body 130. The through hole 140h can be used as a stress releasing hole and/or a positioning hole of the ring-shaped conductive structure 140.

Figure 2:
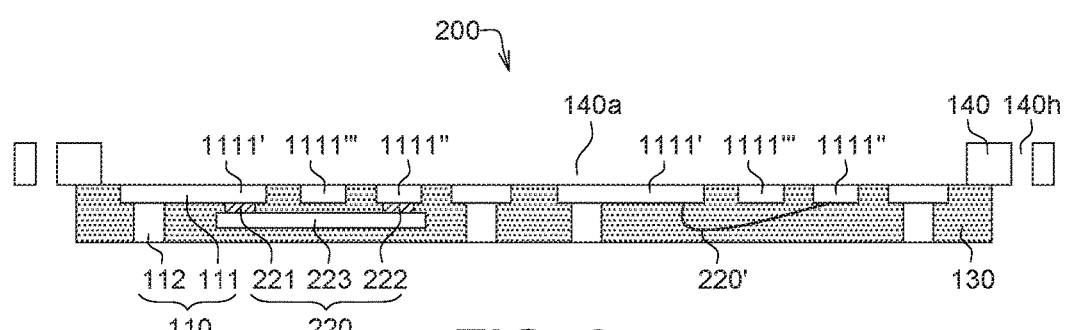
FIG. 2 shows a cross-sectional view of a substrate structure according to another embodiment of the invention.

Referring to FIG. 2, a cross-sectional view of a substrate structure according to another embodiment of the invention is shown. The substrate structure 200 comprises a conductive structure 110, an electrical component 220, a first package body 130 and a ring-shaped conductive structure 140.

In the present embodiment, the trace 1111 comprises a first trace 1111', a second trace 1111" and a third trace 1111'" mutually separated from each other, wherein the third trace 1111'" is located between the first trace 1111' and the second trace 1111". The electrical component 220 is a conductive bracket. The electrical component 220 comprises a first pad 221, a second pad 222 and a connection component 223, wherein the first pad 221 is disposed on the first trace 1111', the second pad 222 is disposed on the second trace 1111", and the connection component 223 connects the first pad 221 and the second pad 222 and is separated from the third trace 1111'" through the first pad 221 and the second pad 222 by a vertical distance to avoid short-circuiting with the third trace 1111'". If the first trace 1111' and the second trace 1111" cannot be electrically connected with each other in the circuit layout stage, the electrical component 220 can electrically connect the first trace 1111' and the second trace 1111" in subsequent processes.

Also, another electrical component 220' can be a solder wire which connects the first trace 1111' and the second trace 1111" and generates an effect similar to that generated by the electrical component 220.

In another embodiment, the electrical component 220 is an active device, wherein the connection component 223 is a semiconductor chip, and a first pad 221 and a second pad 222 are used as connection components and are disposed on the semiconductor chip to constitute a flip-chip. Preferably, the first pad 221 and the second pad 222 are solder bumps or copper conductive studs disposed on the trace 1111 for providing electrical connection function.

Figure 3A:
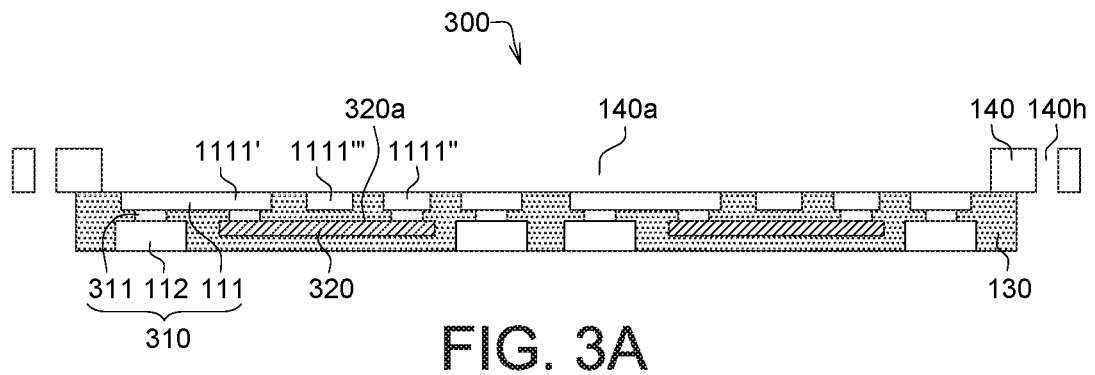
FIG. 3A shows a cross-sectional view of a substrate structure according to another embodiment of the invention.

Referring to FIG. 3A, a cross-sectional view of a substrate structure according to another embodiment of the invention is shown. The substrate structure 300 comprises a conductive structure 110, an electrical component 320, a first package body 130 and a ring-shaped conductive structure 140.

The conductive structure 310 comprises a first conductive layer 111, a second conductive layer 112 and a third conductive layer 311, wherein the third conductive layer 311 is formed between the first conductive layer 111 and the second conductive layer 112. The third conductive layer 311 is formed on the first trace 1111' and the second trace 1111" but not on the third trace 1111'". The electrical component 320 is separated from the third trace 1111'" through the third conductive layer 311 by a distance to avoid short-circuiting with the third trace 1111'". The electrical component 320 is an active chip, and has an active surface 320a facing the third trace 1111'". However, the third conductive layer 311 prevents the active surface 320a from short-circuiting with the third trace 1111'". Preferably but not restrictively, the third conductive layer 311 has a micro-via completely embedded in the first package body 130 for increasing the bonding between the third conductive layer 311 and the first package body 130. Preferably, the third conductive layer 311 has a micro-stud connecting the first conductive layer 111 and the second conductive layer 112. The area of micro-studs is smaller than respective areas of the first conductive layer 111 and the second conductive layer 112. It is noted that the diameter of the micro-stud is smaller than respective diameters of the first conductive layer 111 and the second conductive layer 112.

Figure 3B:
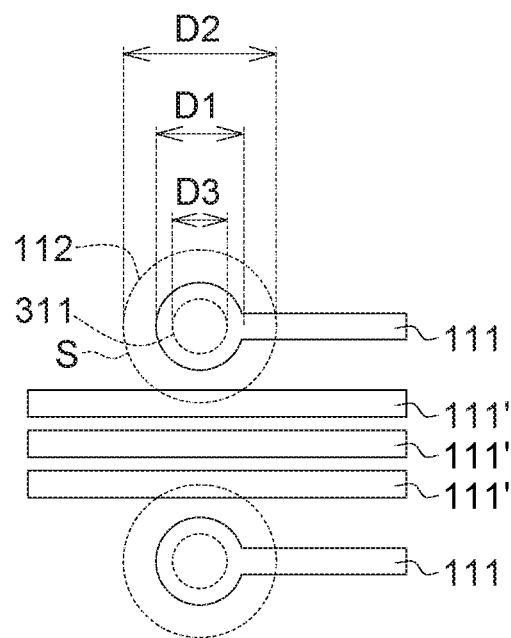
FIG. 3B shows a partial cross-sectional view of FIG. 3A.

Referring to FIG. 3B, a partial cross-sectional view of FIG. 3A is shown. The cross-sections of the first conductive layer 111, the second conductive layer 112 and the third conductive layer 311 are such as circular. The cross-sectional diameter D2 of the second conductive layer 112 is larger than the cross-sectional diameter D3 of the third conductive layer 311. In an embodiment, the cross-sectional diameter D3 of the third conductive layer 311 is about 20~100 μm, and the cross-sectional diameter D2 of the second conductive layer 112 is about 200~300 μm. In addition, the cross-sectional diameter D1 of the first conductive layer 111 is larger than the cross-sectional diameter D3 of the third conductive layer 311. In an embodiment, the cross-sectional diameter D1 of the first conductive layer 111 is about 80~100 μm.

As indicated in FIG. 3B, if the first conductive layer 111 is directly formed on the second conductive layer 112, then the area by which the third conductive layer 311 is electrically connected to the endpoint S is equal to the cross-sectional area of the second conductive layer 112, and the area of the endpoint S being too large incapacitates the formation of the trace 111' of FIG. 3B. In an embodiment of the disclosure, the first conductive layer 111 is electrically connected to the second conductive layer 112 through the third conductive layer 311, such that the first conductive layer 111 is not directly formed on the second conductive layer 112, and the cross-sectional diameter D2 of the second conductive layer 112 is larger than the cross-sectional diameter D3 of the third conductive layer 311. Meanwhile, the area of the part (electrical connection endpoint) by which the first conductive layer 111 is bonded to the third conductive layer 311 can be reduced to be equal to or slightly larger than the cross-sectional area of the third conductive layer 311, and the available space for forming the trace 111' of FIG. 3B is still sufficient. Since more wires can be formed at the electrical endpoint (by which the first conductive layer 111 is electrically connected to the third conductive layer 311) of the first conductive layer 111 (trace), wire density can be increased and wire design is made more flexible.

Figure 4A:
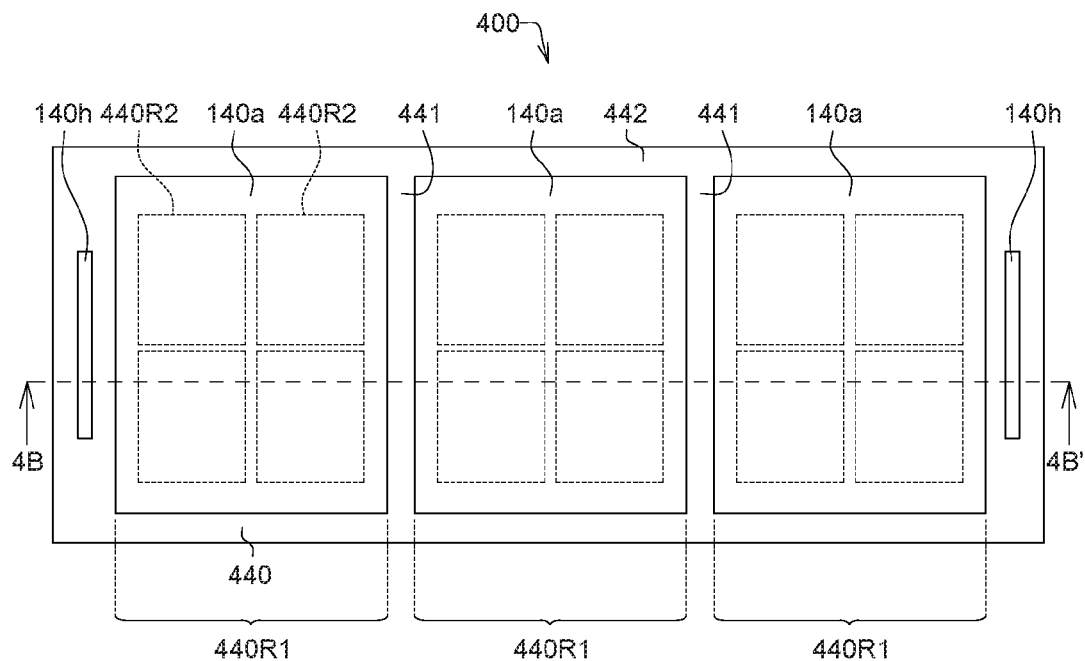
FIG. 4A shows a top view of a substrate structure according to another embodiment of the invention.
Figure 4B:
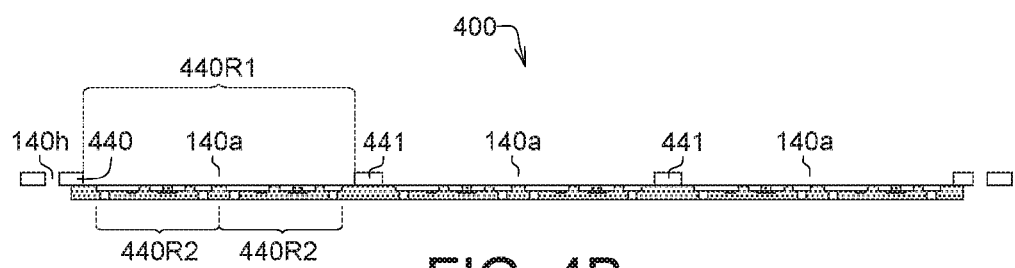
FIG. 4B shows a cross-sectional view along a direction 4B-4B' of FIG. 4.

Referring to FIGS. 4A and 4B. FIG. 4A shows a top view of a substrate structure according to another embodiment of the invention. FIG. 4B shows a cross-sectional view along a direction 4B-4B' of FIG. 4. The substrate structure 400 comprises a conductive structure 110, an electrical component 320, a first package body 130 and a ring-shaped conductive structure 440.

In the present embodiment, the ring-shaped conductive structure 440 comprises several ribs 441, a frame 442 and several openings 140a, wherein every two adjacent openings 140a are separated by a rib 441. The frame 442 can be a closed type or an open type ring-shaped frame. The ribs 441 are connected to the frame 442 for enhancing the overall strength of the ring-shaped conductive structure 440 to avoid the ring-shaped conductive structure 440 being over-warped or deformed. In another embodiment, the ring-shaped conductive structure 440 can omit the disposition of the ribs 441 and has only one opening 140a. In addition, the quantities of the ribs 441 and the openings 140a are not restricted in the embodiment of the invention. In another embodiment, the quantity of the ribs 441 can be one or more than one, and the quantity of the openings 140a can be two or more than two.

One single opening 140a corresponds to one single package unit region 440R1, and each package unit region 440R1 defines several component regions 440R2. At least one chip can be disposed on each component region 440R2 to form a semiconductor package. In the singulating process, a single semiconductor package can be formed by singulating along the boundary of the component region 440R2.

Figure 5:
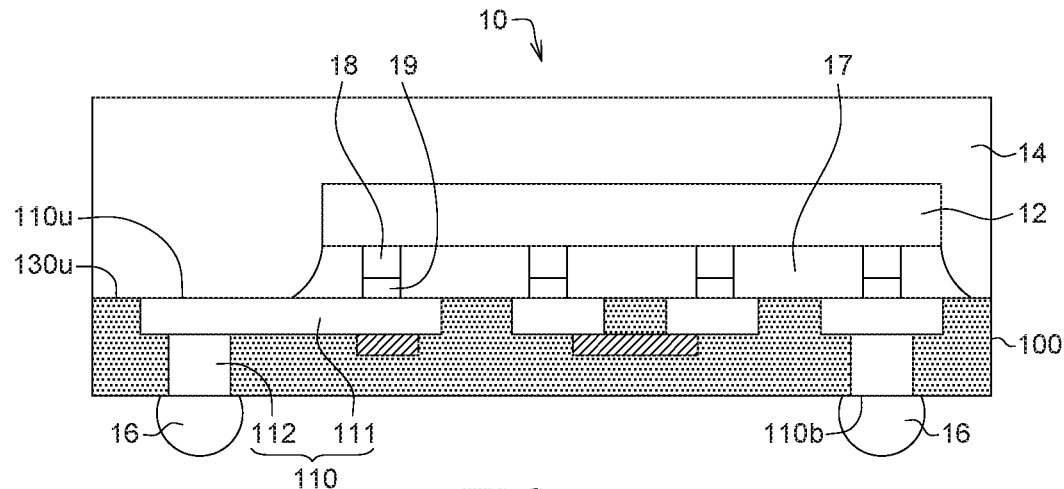
FIG. 5 shows a cross-sectional view of a semiconductor package according to an embodiment of the invention.

Referring to FIG. 5, a cross-sectional view of a semiconductor package according to an embodiment of the invention is shown. The semiconductor package 10 comprises a substrate structure 100, a semiconductor chip 12, a second package body 14 and an underfill 17. The semiconductor chip 12 is electrically connected to the conductive structure 110 through at least one connection structure. In the present embodiment, the semiconductor chip 12 is disposed on the conductive structure 110 with the active surface facing downwards. Preferably, the connection structure comprises a solder ball or a conductive stud 18 and a solder 19. The second package body 14 encapsulates the semiconductor chip 12 and covers the upper surface 110u of the conductive structure 110 of the substrate structure 100 and the upper surface 130u of the first package body 130 of the substrate structure 100. The material of the second package body 14 is similar to that of the first package body 130, and the similarities are not repeated here. Preferably, the solder ball 16 is disposed on a lower surface 110b of the conductive structure 110, and the semiconductor package 10 is disposed on and is electrically connected to external circuit board (not illustrated) through the solder ball 16. The underfill 17 encapsulates the conductive stud 18 and the solder 19.

Figure 6:
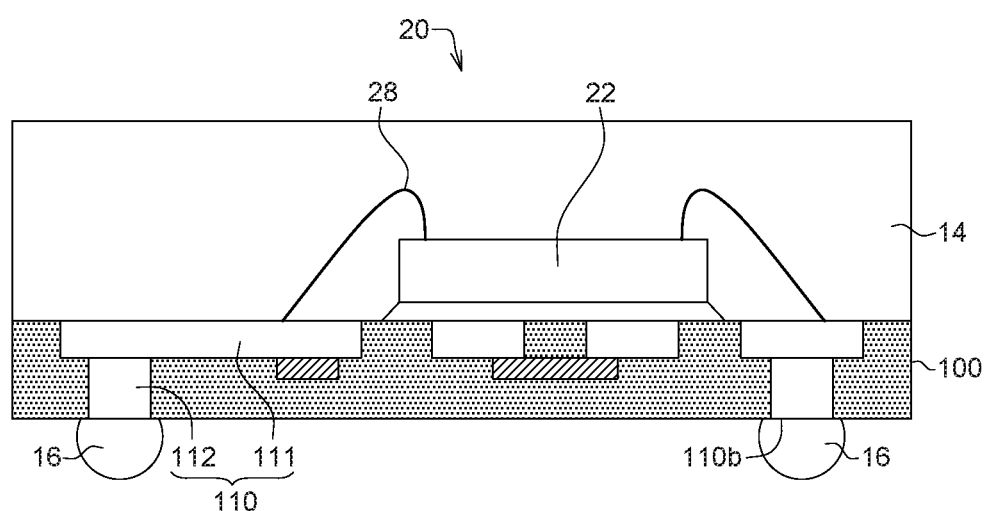
FIG. 6 shows a cross-sectional view of a semiconductor package according to an embodiment of the invention.

Referring to FIG. 6, a cross-sectional view of a semiconductor package according to an embodiment of the invention is shown. The semiconductor package 20 comprises a substrate structure 100, a semiconductor chip 22 and a second package body 14. In the present embodiment, the semiconductor chip 22 is disposed on the conductive structure 110 with the active surface facing upwards, and is electrically connected to the conductive structure 110 through at least one solder wire 28.

Figure 7A:
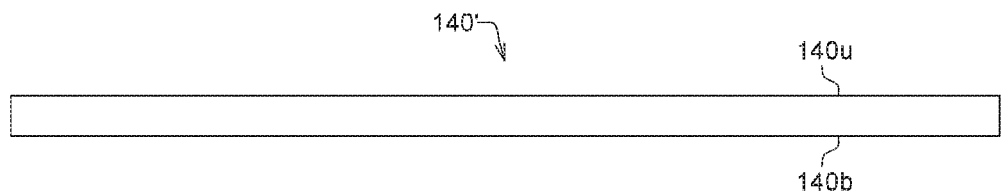
FIGS. 7A~7T are processes of a manufacturing method of semiconductor package according to an embodiment of the invention.
Figure 7B:
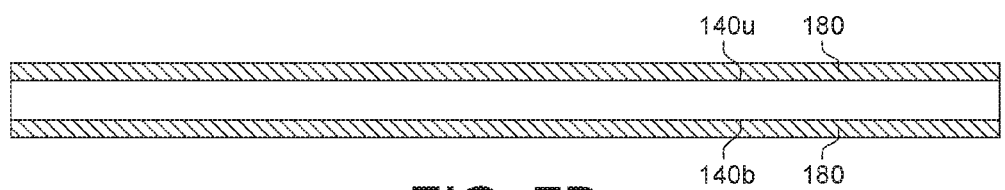
Figure 7C:
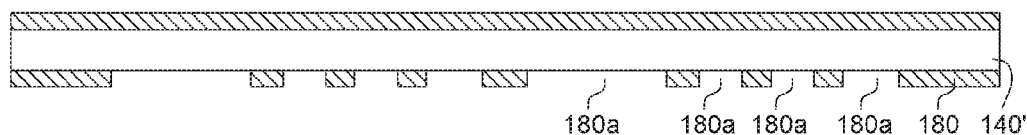
Figure 7D:
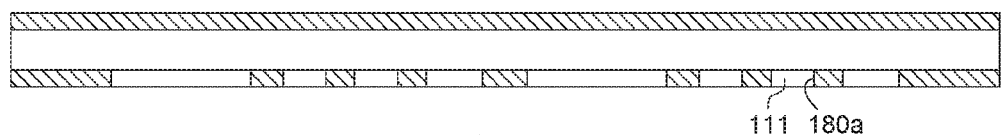
Figure 7E:
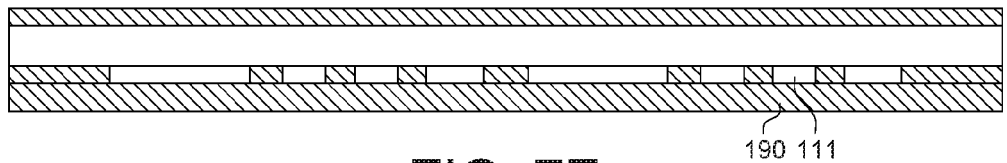
Figure 7F:
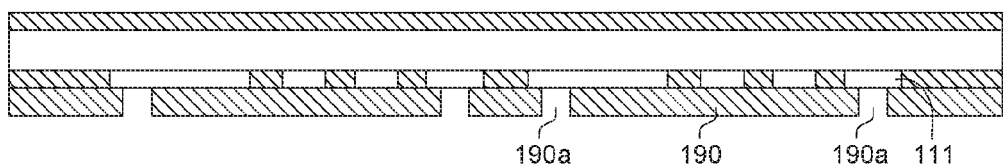
Figure 7G:
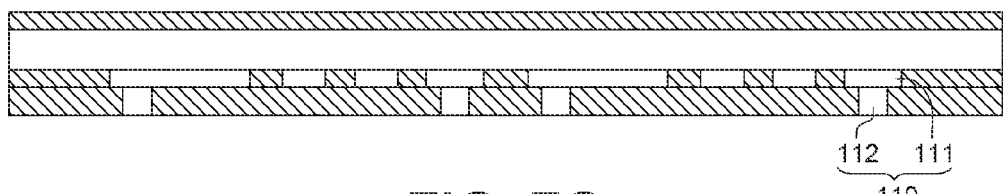
Figure 7H:
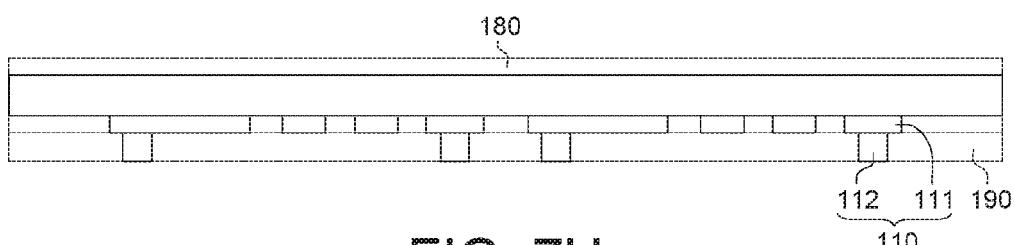
Figure 7I:
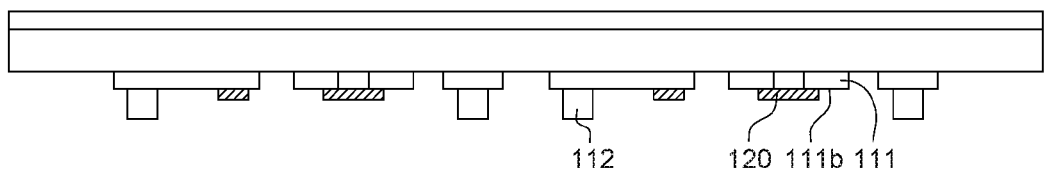
Figure 7J:
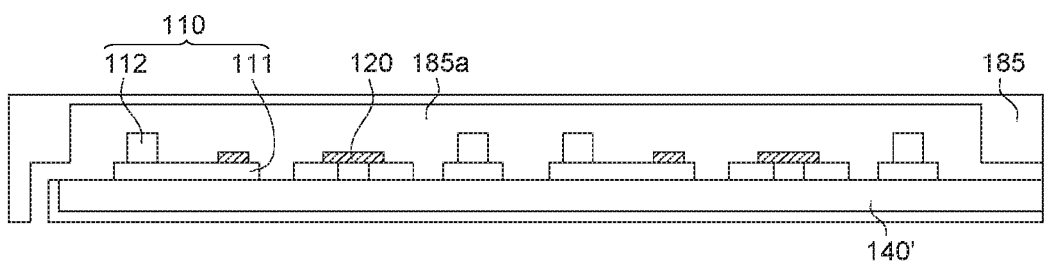
Figure 7K:
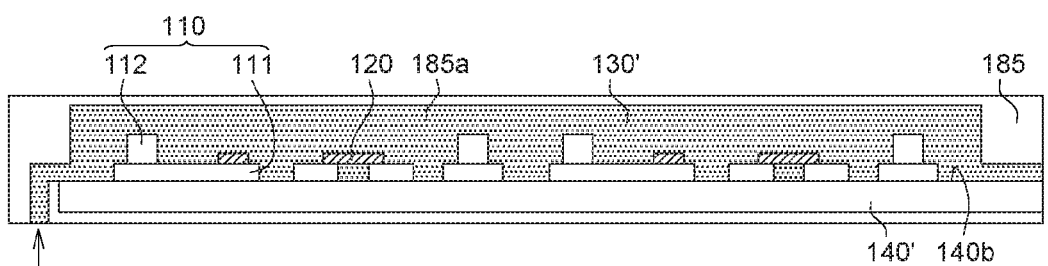
Figure 7L:
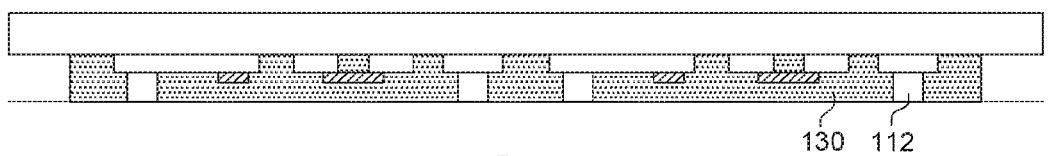
Figure 7M:
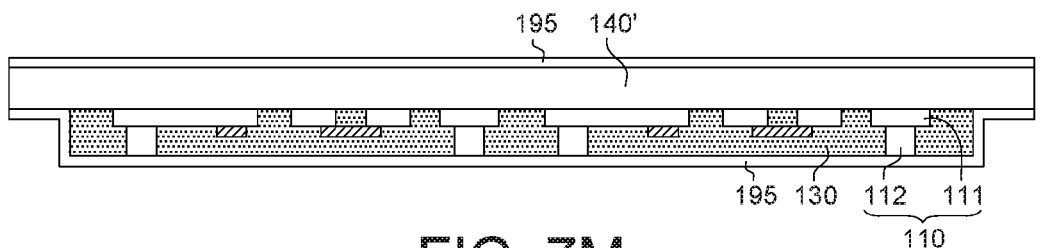
Figure 7N:
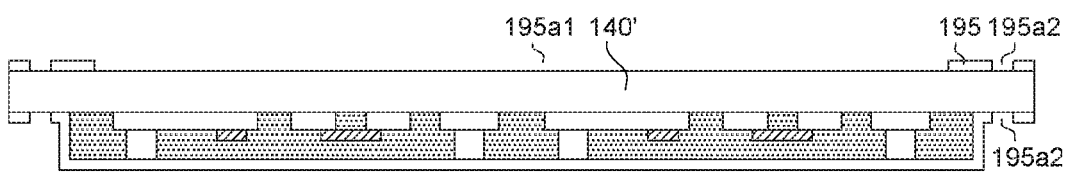
Figure 7O:
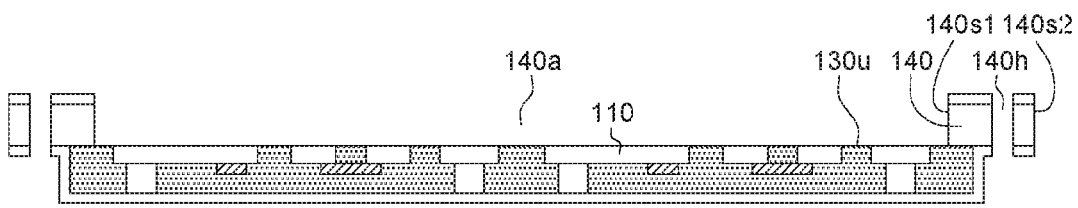
Figure 7P:
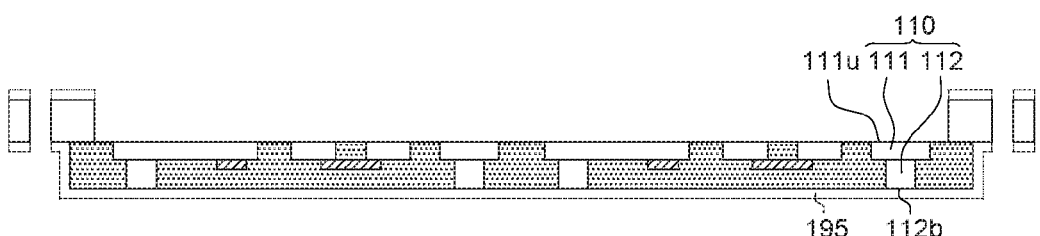
Figure 7Q:
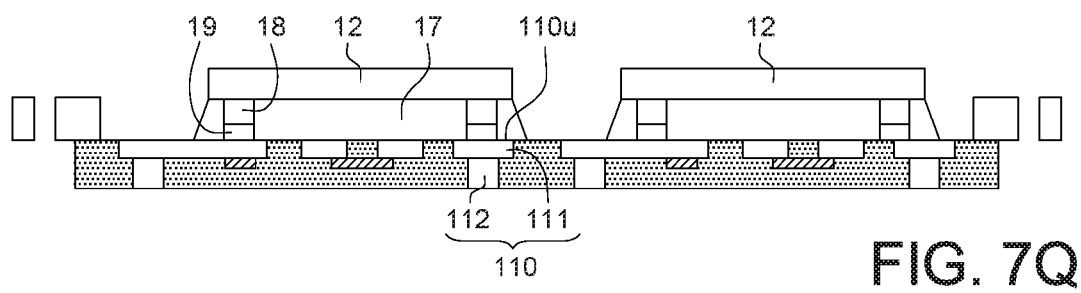
Figure 7R:
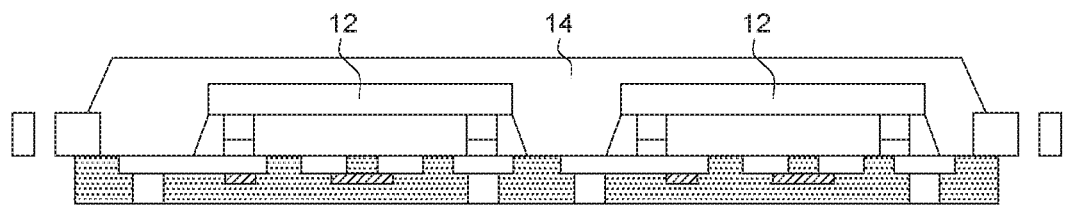
Figure 7S:
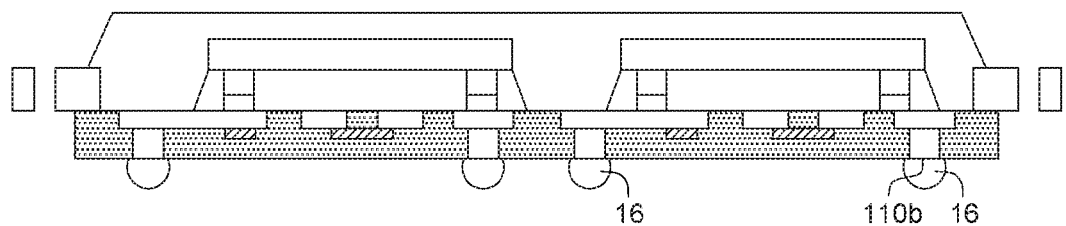
Figure 7T:
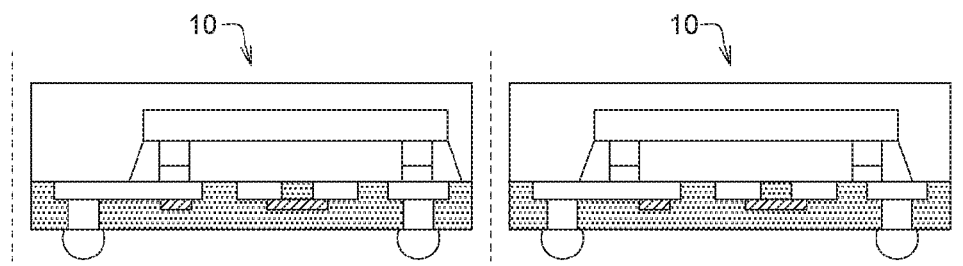

Referring to FIGS. 7A~7T, processes of a manufacturing method of semiconductor package according to an embodiment of the invention are shown.

As indicated in FIG. 7A, a conductive carrier 140' is provided, wherein the conductive carrier 140' has an upper surface 140u and a lower surface 140b opposite to the upper surface 140u.

The conductive carrier 140' is such as a copper layer or a composite metal layer having a copper clad layer. The composite metal layer comprises an inner layer and a copper clad layer, wherein the thickness of the inner layer is larger than that of the copper clad layer. The inner layer is an alloy containing steel or more than two of iron, carbon, magnesium, phosphorus, sulfur, chromium, and nickel. The material of the copper clad layer is different from that of the inner layer and is therefore able to provide better etching blocking in subsequent process. Moreover, the copper clad layer makes the conductive carrier 140' used and operated as a complete copper layer, so that the manufacturing cost can be further reduced. Since the coefficient of thermo expansion (CTE) of the inner layer is close to that of the packaging material used for encapsulating the semiconductor chip, the semiconductor package using the conductive carrier 140' has lesser degree of warpage and has a larger area such that more semiconductor packages can be formed on the conductive carrier 140'.

As indicated in FIG. 7B, a first photo-resist layer 180 can be formed by the coating process for covering the upper surface 140u and the lower surface 140b of the conductive carrier 140' respectively.

As indicated in FIG. 7C, the first photo-resist layer 180 is patterned by the etching process to form a plurality of first openings 180a and expose a portion of the conductive carrier 140'.

As indicated in FIG. 7D, a first conductive layer 111 is formed in the first opening 180a by electro-plating a first conductive material. Since the electro plating process is used, the line width and line spacing of the first conductive layer 111 can reach the level of 10 μm. The first conductive layer can be formed by copper, nickel, palladium, gold (Au) or other materials.

As indicated in FIG. 7E, a second photo-resist layer 190 is formed by the coating process for covering the first conductive layer 111.

As indicated in FIG. 7F, a plurality of second opening 190a are formed in the second photo-resist layer 190 by the etching process to expose the first conductive layer 111.

As indicated in FIG. 7G, a second conductive layer is formed in the second opening 190a by the electro-plating process to form the second conductive layer 112, wherein the second conductive layer 112 and the first conductive layer 111 together constitute the conductive structure 110. The variety of second conductive layer is similar to that of the first conductive layer.

As indicated in FIG. 7H, a first photo-resist layer 180 and a second photo-resist layer 190 can be removed by the etching and developing process at one time to expose the first conductive layer 111, the second conductive layer 112 and the conductive carrier 140'.

As indicated in FIG. 7I, an electrical component 120 can be disposed on the lower surface 111b of the first conductive layer 111 by the surface mounting technology (SMT) or the thermo-compression bonding (TCB) process.

As indicated in FIG. 7J, the conductive structure 110 is disposed in the cavity 185a of the mold 185.

As indicated in FIG. 7K, a liquid-state thermosetting material 130' is infused to the cavity 185a in an environment of high temperature and high pressure for encapsulating the first conductive layer 111, the second conductive layer 112 and the electrical component 120, but not covering the edge of the lower surface 140b of the conductive carrier 140'. The liquid-state thermosetting material 130' is cured to form the first package body 130.

In an embodiment, before the thermosetting material 130' is infused to the cavity 185a, a surface treatment process can be applied on the surface of the conductive structure 110 (the first conductive layer 111, the second conductive layer 112 and the third conductive layer 311) by the chemical process or plasma for increasing the bonding between the surface and the first package body 130.

When the package body is formed by the lamination process, the delicate metal structure of the package body may be easily damaged by the operating pressure. In the present embodiment of the disclosure, the thermosetting material 130' is heated and liquidized by the transfer molding process and then the liquid-state thermosetting material 130' is infused to the cavity 185a of the mold 185 in an environment of high temperature and high pressure without damaging the structure of the first conductive layer 111, the second conductive layer 112 and the third conductive layer 311. As the thermosetting material 130' is infused to the cavity 185a of the mold 185 in a liquid state, the liquid-state thermosetting material 130' can completely encapsulate the first conductive layer 111, the second conductive layer 112 and the third conductive layer 311. Since the thermosetting material 130' does not damage the structure of conductive layers exposed in a high operating pressure, the high pressure condition can be used to suppress the generation of gas so as to provide excellent bonding between the first package body 130 and the first conductive layer 111, the second conductive layer 112 and the third conductive layer 311. In addition, since the transfer molding process is performed in an environment of high temperature and high pressure, excellent tightness is generated between the first package body 130 and the conductive layers 111, 112 and 311 to avoid the conductive layers 111, 112 and 311 being damaged in subsequent etching process.

As indicated in FIG. 7L, a portion of the first package body 130 can be removed by the polishing process until the second conductive layer 112 is exposed.

As indicated in FIG. 7M, a third photo-resist layer 195 can be formed by the coating process for encapsulating the conductive carrier 140', the first package body 130 and the conductive structure 110.

As indicated in FIG. 7N, a third opening 195a1 and a fourth opening 195a2 are formed in the third photo-resist layer 195 by the etching process to expose a portion of the conductive carrier 140'.

As indicated in FIG. 7O, an opening 140a and a through hole 140h are respectively formed in the conductive carrier 140' through the third opening 195a1 and the fourth opening 195a2 by the etching process, so that the conductive carrier 140 can become ring-shaped. The ring-shaped conductive structure 140 maintained on the upper surface 130u of the first package body 130 surrounds the conductive structure 110 and the electrical component 120 and exposes the upper surface 110u of the conductive structure 110. In greater details, the opening 140a exposes the upper surface 110u of the conductive structure 110, and the through hole 140h is located between the inner wall 140s1 and the outer wall 140s2 of the opening 140a without overlapping the first package body 130.

As indicated in FIG. 7P, the third photo-resist layer 195 can be removed by the etching process. Then, a portion of the first conductive layer 111 can be removed by the micro-etching technology, so that the upper surface 111u of the first conductive layer 111 is depressed with respect to the upper surface 130u of the first package body 130 (as indicated in FIG. 1). Similarly, a portion of the second conductive layer 112 can be removed by the micro-etching technology, so that the lower surface 112b of the second conductive layer 112 is depressed with respect to the lower surface 130b of the first package body 130. Then, the first surface finishing layer 113 and the second surface finishing layer 114 of FIG. 1 are formed, and the substrate structure 100 of FIG. 1 is formed accordingly.

As indicated in FIG. 7Q, at least one semiconductor chip 12 can be disposed on the upper surface 110u of the conductive structure 110 by the surface mounting technology. The semiconductor chip 12 is such as a flip-chip. Then, an underfill 17 can be formed for encapsulating the solder 19 and the conductive stud 18 of the semiconductor chip 12.

As indicated in FIG. 7R, a second package body 14 can be formed for encapsulating the semiconductor chip 12, wherein the process for forming the second package body 14 is similar to that used for forming the first package body 130.

As indicated in FIG. 7S, at least one solder ball 16 is formed on the lower surface 110b of the conductive structure 110.

As indicated in FIG. 7T, the first package body 130 and the second package body 16 can be singulated by using laser or knife to form at least one semiconductor package 10 of FIG. 5.

In another embodiment, the semiconductor chip 12 can be replaced with the semiconductor chip 22 for forming the semiconductor package 20 of FIG. 6.

In addition, the process for forming the substrate structures 200, 300 and 400 is similar to the process for forming the substrate 100, and the similarities are not repeated here.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of semiconductor package, comprising:
    providing a conductive carrier, wherein the conductive carrier has an upper surface and a lower surface opposite to the upper surface;
    forming a first conductive layer on the lower surface of the conductive carrier, wherein the first conductive layer has a lower surface;
    forming a second conductive layer on the lower surface of the first conductive layer, wherein the second conductive layer and the first conductive layer together constitute a conductive structure;
    disposing an electrical component on the lower surface of the first conductive layer;
    forming a first package body encapsulating the first conductive layer, the second conductive layer and the electrical component but not covering an edge of the lower surface of the conductive carrier;
    removing a portion of the first package body until the second conductive layer is exposed; and
    removing partial material of the conductive carrier, such that a reserved part of the conductive carrier forms a ring-shaped conductive structure, wherein the ring-shaped conductive structure maintained on the upper surface of the package body surrounds the conductive structure and the electrical component and exposes the upper surface of the conductive structure.

2. The manufacturing method according to claim 1, wherein the first conductive layer comprises a plurality of traces;
    in the step of disposing the electrical component on the lower surface of the first conductive layer, the electrical component crosses over two of the traces.

3. The substrate structure according to claim 1, wherein the electrical component is a passive component, an active chip, a solder wire or a conductive bracket.

4. The manufacturing method according to claim 1, wherein the first conductive layer comprises a first trace, a second trace and a third trace mutually separated from one another, and the third trace is located between the first trace and the second trace;
    in the step of disposing the electrical component on the lower surface of the first conductive layer, the electrical component is a conductive bracket and comprises a first pad, a second pad and a connection component, the connection component connects the first pad and the second pad, and the electrical component is disposed on the second trace with the first pad being disposed on the first trace and the second pad and separated from the third trace by a distance through the first pad and the second pad.

5. The manufacturing method according to claim 1, further comprising:
    forming a third conductive layer on the lower surface of the first conductive layer, wherein the first conductive layer comprises a first trace, a second trace and a third trace mutually separated from one another, the third trace is located between the first trace and the second trace, and the third conductive layer is formed on the first trace and the second trace but not on the third trace;
    forming the second conductive layer on the third conductive layer;
    in the step of disposing the electrical component on the lower surface of the first conductive layer, the electrical component is an active chip and is separated from the third trace by a distance through the third conductive layer.

6. The manufacturing method according to claim 5, wherein in the step of disposing the electrical component on the lower surface of the first conductive layer, the electrical component has an active surface, and the electrical component is disposed on the third conductive layer with the active surface facing the third trace.

7. The manufacturing method according to claim 1, wherein the step of removing partial material of the conductive carrier comprises:
    forming an opening and a through hole on the conductive carrier, wherein the opening exposes the upper surface of the conductive structure, and the through hole is located between an inner wall and an outside wall of the opening without overlapping the package body.

8. The manufacturing method according to claim 1, wherein the first conductive layer comprises a plurality of traces, and the second conductive layer comprises a plurality of the conductive studs each being disposed on the corresponding trace.

9. The manufacturing method according to claim 1, further comprising:
    disposing a semiconductor chip on the upper surface of the wire structure;
    forming a second package body encapsulating the semiconductor chip; and
    singulating the second package body and the first package body.

10. The manufacturing method according to claim 1, further comprising:
    singulating the first package body.

11. The manufacturing method according to claim 1, further comprising:
    forming a first photo-resist layer covering the upper surface and the lower surface of the conductive carrier;
    forming a plurality of first openings in the first photo-resist layer to expose a portion of the conductive carrier;
    forming a first conductive layer in the first opening to form the first conductive layer;
    forming a second photo-resist layer covering the first conductive layer;
    forming a plurality of second openings in the second photo-resist layer to expose the first conductive layer; and
    forming a second conductive layer in the second opening to form the second conductive layer.

12. The manufacturing method according to claim 1, further comprising:
    removing the first photo-resist layer and the second photo-resist layer at one time.

13. The manufacturing method according to claim 1, wherein the step of forming the first package body comprises:
- disposing the conductive structure in a cavity of a mold;
- infusing a liquid-state thermosetting material to the cavity for encapsulating the conductive structure; and
- solidifying the liquid-state thermosetting material to form the package body.

14. The manufacturing method according to claim 1, further comprising:
- etching the upper surface of the first conductive layer to form a first depressed portion; and
- forming a first surface finishing layer in the first depressed portion.

15. The manufacturing method according to claim 1, further comprising:
- etching the lower surface of the second conductive layer to form a second depressed portion; and
- forming a second surface finishing layer in the second depressed portion.

16. The manufacturing method according to claim 1, wherein the conductive carrier is a copper layer or a composite metal layer having a copper clad layer.

* * * * *